United States Patent
Hur et al.

(10) Patent No.: US 10,477,670 B2
(45) Date of Patent: Nov. 12, 2019

(54) FLEXIBLE CIRCUIT BOARD ASSEMBLY FOR LED LAMP

(71) Applicant: LEDLITEK CO., LTD, Sejong (KR)

(72) Inventors: Jeong Wook Hur, Seoul (KR); Young Min Yoon, Gyeonggi-do (KR); Hwang Ryong Kim, Sejong (KR)

(73) Assignee: LEDLITEK CO., LTD, Sejong-si (KR)

( * ) Notice: Subject to any disclaimer, the term of this patent is extended or adjusted under 35 U.S.C. 154(b) by 61 days.

(21) Appl. No.: 15/556,627

(22) PCT Filed: Mar. 9, 2016

(86) PCT No.: PCT/KR2016/002339
§ 371 (c)(1),
(2) Date: Sep. 8, 2017

(87) PCT Pub. No.: WO2016/144090
PCT Pub. Date: Sep. 15, 2016

(65) Prior Publication Data
US 2018/0049308 A1 Feb. 15, 2018

(30) Foreign Application Priority Data
Mar. 9, 2015 (KR) .......... 10-2015-0032199

(51) Int. Cl.
*F21V 29/70* (2015.01)
*F21V 29/89* (2015.01)
(Continued)

(52) U.S. Cl.
CPC ....... *H05K 1/0204* (2013.01); *F21V 19/0025* (2013.01); *F21V 29/70* (2015.01);
(Continued)

(58) Field of Classification Search
CPC ........ H05K 1/0204; H05K 1/028; H05K 1/09; H05K 1/181; H05K 1/189; H05K 1/0209;
(Continued)

(56) References Cited

U.S. PATENT DOCUMENTS

| 2001/0030866 A1* | 10/2001 | Hochstein ............ F21V 29/004 362/294 |
| 2013/0130418 A1* | 5/2013 | Lee ....................... H05K 1/0206 438/26 |
| 2013/0228363 A1* | 9/2013 | Hattori ................. H05K 3/4092 174/254 |

FOREIGN PATENT DOCUMENTS

| JP | 2013-030599 A | 2/2013 |
| JP | 2013-045788 A | 3/2013 |

(Continued)

OTHER PUBLICATIONS

International Search Report dated Jun. 27, 2016 in related International Application No. PCT/KR2016/002339.
(Continued)

*Primary Examiner* — Bao Q Truong
(74) *Attorney, Agent, or Firm* — Eric L. Lane; Green Patent Law

(57) ABSTRACT

A flexible circuit board assembly for an LED lamp of the present disclosure comprises: a resin layer having a strip shape; a conductive signal line layer formed from a predetermined pattern provided on the upper part of the resin layer; and a radiation layer provided on the lower part of the resin layer, having a thickness relatively thicker than that of the conductive signal line layer, and radiating the heat generated from an LED mounted on the signal line layer, wherein the signal line layer and the radiation layer are made from one material from among copper, aluminum, copper alloy and an aluminum alloy.

2 Claims, 4 Drawing Sheets

(51) Int. Cl.
*H05K 1/02* (2006.01)
*F21V 19/00* (2006.01)
*H05K 1/09* (2006.01)
*H05K 1/18* (2006.01)
*F21Y 115/10* (2016.01)
*F21K 9/00* (2016.01)
*H05K 1/05* (2006.01)

(52) U.S. Cl.
CPC ............. *F21V 29/89* (2015.01); *H05K 1/028* (2013.01); *H05K 1/09* (2013.01); *H05K 1/181* (2013.01); *H05K 1/189* (2013.01); *F21K 9/00* (2013.01); *F21Y 2115/10* (2016.08); *H05K 1/0209* (2013.01); *H05K 1/053* (2013.01); *H05K 2201/066* (2013.01); *H05K 2201/09072* (2013.01); *H05K 2201/10106* (2013.01); *H05K 2201/10113* (2013.01)

(58) Field of Classification Search
CPC ............. H05K 1/053; H05K 2201/066; H05K 2201/09072; H05K 2201/10106; H05K 2201/10113; F21V 29/70; F21V 29/89; F21V 19/0025; F21Y 2115/10; F21K 9/00
See application file for complete search history.

(56) References Cited

FOREIGN PATENT DOCUMENTS

| KR | 10-0275080 B1 | 9/2000 |
|----|---------------|--------|
| KR | 10-2009-0054898 A | 6/2009 |
| KR | 10-2010-0110163 A | 10/2010 |
| KR | 10-2010-0112214 A | 10/2010 |
| KR | 10-2011-0086541 A | 7/2011 |
| KR | 10-1134671 B1 | 4/2012 |
| KR | 10-1235701 B1 | 2/2013 |

OTHER PUBLICATIONS

Written Opinion dated Jun. 27, 2016 in related International Application No. PCT/KR2016/002339.

\* cited by examiner

FLEXIBLE CIRCUIT BOARD ASSEMBLY FOR LED LAMP

TECHNICAL FIELD

The present disclosure relates to a flexible circuit board assembly, and more particularly, to a flexible circuit board assembly for a light emitting diode (LED) lamp with which it is easy to maintain a heat dissipation property and a shape.

BACKGROUND ART

In general, various substrates such as a ceramic substrate, a resin substrate, and the like are used for mounting electronic components, such as a semiconductor device and the like, thereon. Such substrates have an excellent insulation property, but have weak strength and are vulnerable to external impact, and are often damaged during an assembly process. In addition, it is difficult for the above substrates to be used as a substrate for mounting a highly heat-dissipating electronic component, such as a light emitting diode (LED) lamp, generating a large amount of heat. A conventional aluminum substrate has a structure in which aluminum plate and a copper plate are laminated with an adhesive and the adhesive acts as an insulator. At this time, if the employed adhesive is an epoxy-based adhesive, there is a problem that the adhesive is peeled off as a temperature of the aluminum substrate is increased, on the contrary, a ceramic-based adhesive is resistant to heat but is expensive. In terms of price, which is one of the most important factors of competitiveness of products, the aluminum substrate is not competitive because the copper plate is utilized.

In particular, a lamp unit, such as a headlight, a brake light, a turn signal lamp or the like for a vehicle, is manufactured to have a curvature in consideration of a vehicle design. In an illumination lamp mounted in the curved lamp unit, in order to be able to irradiate light only forward or backward, a support body supporting the substrate is formed into a stepped shape and an illumination member such as the LED lamp is mounted on the stepped mounting surface using a flexible substrate. Korean Patent Registration No. 1235701 discloses a flexible circuit board for an LED backlight and a method of manufacturing the same, and Korean Patent Laid-Open Publication No. 2011-0086541 discloses a method of manufacturing advertisement using a light source module composed of a soft film type printed circuit board and an LED lamp. In addition, in Korean Patent Registration No. 10275080, a circuit board for mounting an LED and a method of manufacturing the same are disclosed, and Korean Patent Laid-open Publication No. 10-2009-0054898 discloses a method of joining and installing a lamp structure, which has an LED lamp to be mounted on a flexible printed circuit board (F-PCB) as one example of the above-described lamp unit, on a stepped-formed base plate.

The conventional flexible circuit boards disclosed above have problems in which it is difficult to maintain the shape of each circuit board in which a circuit pattern layer is formed on a flexible resin layer, and when an LED module is mounted on the flexible circuit board, a heat dissipation property cannot be improved.

DISCLOSURE

Technical Problem

The present invention is directed to providing a flexible circuit board assembly for a light emitting diode (LED) lamp capable of improving a heat dissipation property with respect to heat emitted from a mounted LED and easily maintaining a shape thereof in a predetermined pattern.

In addition, the present invention is directed to providing a flexible circuit board assembly for an LED lamp capable of improving production efficiency by increasing the degree of freedom of pattern design.

One aspect of the present invention provides a flexible circuit board assembly for an LED lamp including a resin layer in a strip shape, a signal line layer having conductivity and formed in a predetermined pattern on an upper surface of the resin layer, and a heat dissipation layer formed on a lower surface of the resin layer, having a thickness relatively thicker than that of the signal line layer having conductivity and dissipates heat generated from an light emitting diode mounted on the signal line layer, wherein the signal line layer and the heat dissipation layer are formed of one of copper, aluminum, a copper alloy, and an aluminum alloy.

A thickness of the heat dissipation layer may be formed in a range of 1.5 to 4 times that of the signal line layer, and the heat dissipation layer may be continuously or discontinuously formed on a lower surface of the resin layer in the strip shape.

The heat dissipation layer may be divided into predetermined patterns, and the divided heat dissipation layer and the signal line layer on which the light emitting diode is mounted may be connected to each other by a heat transfer layer with which at least one through hole formed in the resin layer is filled.

Advantageous Effects

A flexible circuit board assembly for a light emitting diode (LED) lamp of the present disclosure can improve a heat dissipation property with respect to heat generated from an LED mounted on a flexible circuit board and can maintain the flexible circuit board in a predetermined shape, thereby facilitating installation. In addition, the maintenance of the shape of the flexible circuit board can increase the applicability of the product, and furthermore, the degree of freedom in designing the product can be increased.

MODES OF THE INVENTION

Figure 1:
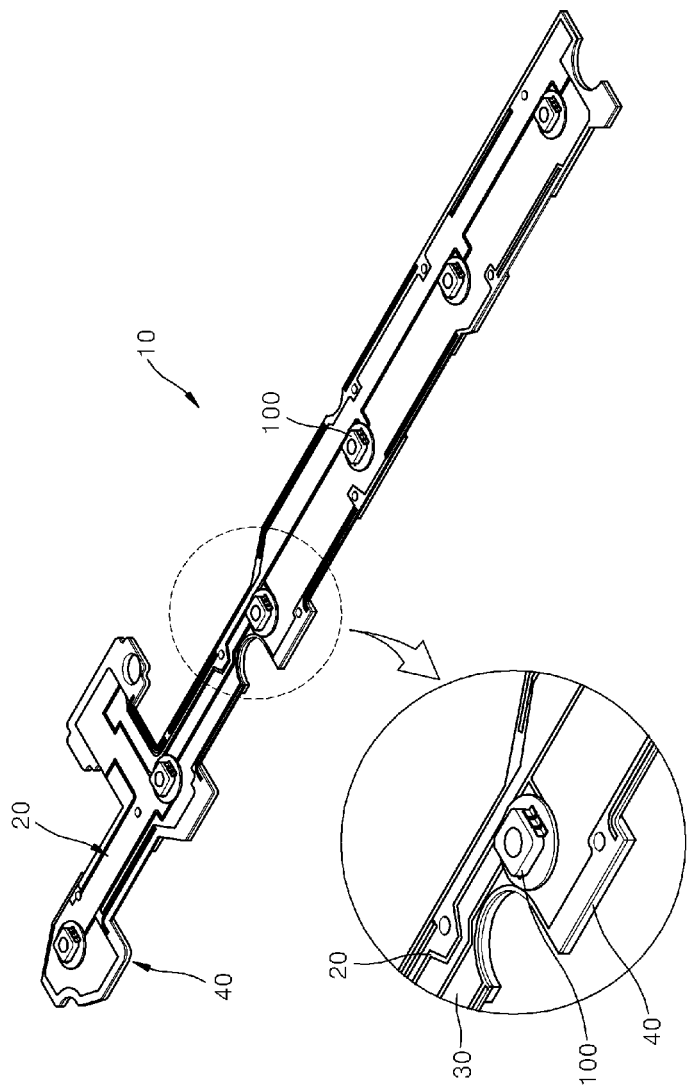
FIG. 1 is a perspective view of a flexible circuit board assembly for a light emitting diode (LED) lamp according to the present disclosure.
Figure 2:
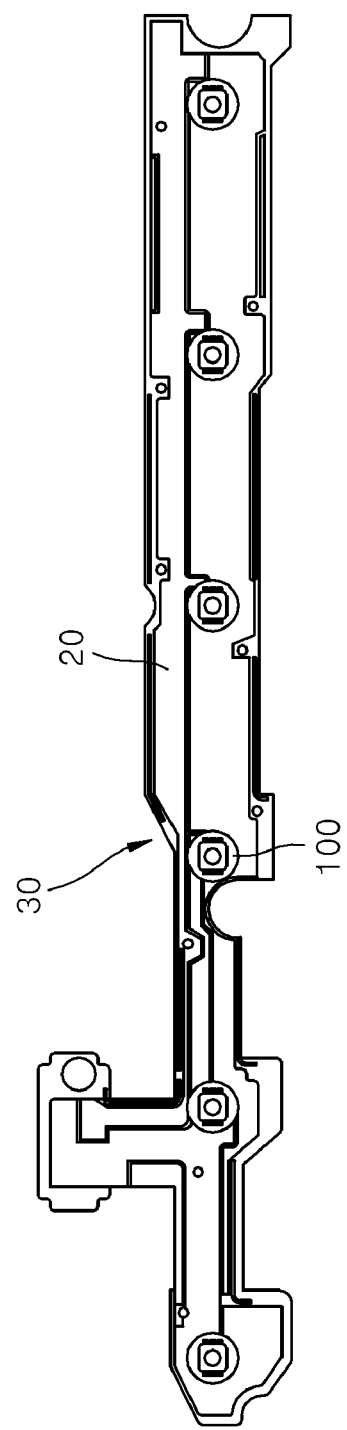
FIG. 2 is a plan view of the flexible circuit board assembly for the LED lamp illustrated in FIG. 1.
Figure 3:
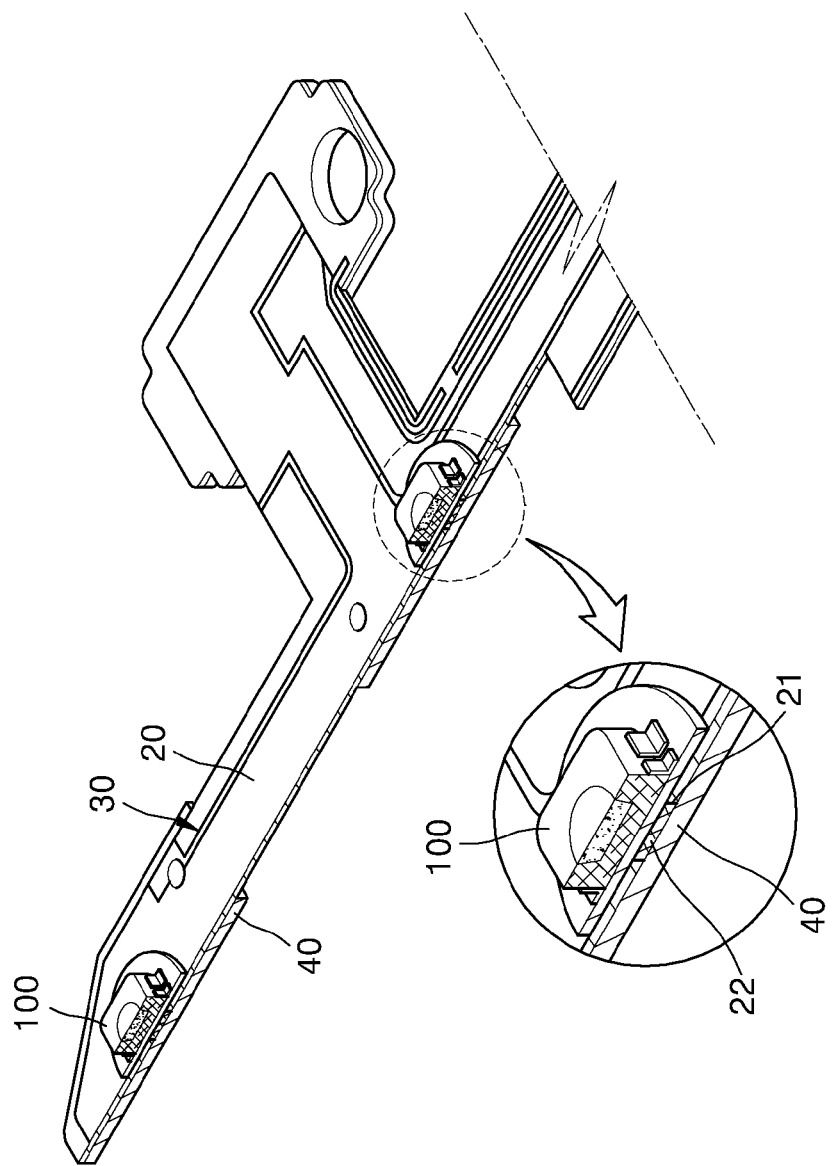
FIG. 3 is a partial cutaway perspective view of the flexible circuit board assembly for the LED lamp according to the present disclosure.

The present disclosure relates to a flexible circuit board assembly for a light emitting diode (LED) lamp, and one embodiment thereof is shown in FIGS. 1 to 3.

Referring to the drawings, a flexible circuit board assembly 10 for an LED lamp according to the present disclosure may be used in combination lamps for vehicles, indoor lamps, various electronic products, and the like, and includes a resin layer 20 in a strip shape and a conductive signal line layer 30 formed in a predetermined pattern on an upper surface of the resin layer 20. The resin layer 20 may be formed of a polyimide resin, but is not limited thereto, and may be formed of a material having an insulating property and flexibility.

The conductive signal line layer 30 is formed on an upper surface of an insulator to supply power to an LED module to be mounted thereon, and is formed as a thin film layer through which an electric current may flow. The conductive signal line layer 30 may be formed of copper, a copper alloy, aluminum, or an aluminum alloy. In addition, on the conductive signal line layer 30, terminals of the LED lamp and a pad layer for surface-mounting may be formed.

A heat dissipation layer 40, whose thickness is relatively greater than a thickness of the conductive signal line layer 30, is formed under the resin layer 20. A thickness of the heat dissipation layer 40 is in a range of 1.5 to 4 times that of the conductive signal line layer 30 and it is preferable that the heat dissipation layer 40 be formed to be provided on an entire surface area of a lower surface of the resin layer formed in a strip shape. When the thickness of the heat dissipation layer is 1.5 times or less that of the conductive signal line layer, there is a problem that the heat dissipation layer has a poor heat dissipation property and the shape thereof may not be maintained at the time of bending, and when the thickness of the heat dissipation layer is four times or more that of the conductive signal line layer 30, the heat dissipation layer has poor workability for bending and is difficult to form through a plating operation. The heat dissipation layer 40 may be formed of one material of copper, aluminum, a copper alloy, and an aluminum alloy, and uneven portions may be formed on a lower surface of the heat dissipation layer for increasing the surface area thereof, wherein it is preferable to form the uneven portions in a direction perpendicular to a longitudinal direction of the heat dissipation layer.

In addition, the heat dissipation layer 40 is divided into the same number of segments as the number of terminals of an LED lamp 100 mounted on the conductive signal line layer 30 to be connected to the conductive signal line layer 30 via a heat transfer layer 22 with which a through hole 21 formed in the resin layer 20 is filled.

When the heat transfer layer 22 with which the through hole 21 is filled is formed of a non-conductive material, the heat dissipation layer 40 may not have a divided configuration.

Figure 4:
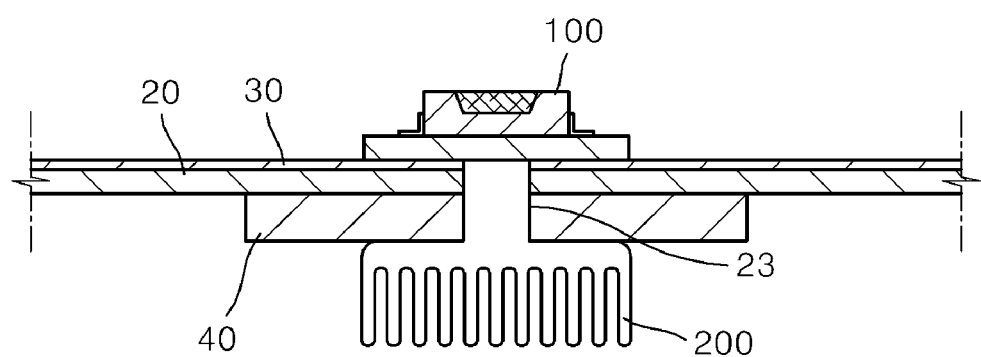
FIG. 4 is a cross-sectional view illustrating another embodiment of the flexible circuit board assembly for the LED lamp according to the present disclosure.

In addition, as shown in FIG. 4, a hole 23 is formed in sides of the resin layer 20 and the heat dissipation layer 40 corresponding to a region where the LED lamp 100 is mounted, and a heat dissipation member 200 may be installed to connect the heat dissipation layer 40 and a lower surface of the LED lamp 100 to transmit heat generated from the LED lamp 100 to the heat dissipation layer 40.

Furthermore, although not shown in the drawings, it is preferable that the lower surface of the heat dissipation layer 40 be formed with uneven portions to increase the surface area thereof. The uneven portions formed on the lower surface of the heat dissipation layer 40 may be formed by etching or mechanical machining.

An effect of the flexible circuit board assembly for the LED lamp according to the present disclosure constructed as described above will be described below.

In the flexible circuit board assembly for the LED lamp according to the present disclosure, since the conductive signal line layer 30 is formed on the upper surface of the resin layer 20 and the heat dissipation layer 40 having a relatively thick thickness is formed on a lower surface of the resin layer, it is easy to dissipate heat generated from the LED lamp 100, i.e., an LED, mounted on the conductive signal layer 30.

Since the conductive signal line layer 30 and the LED lamp 100 are surface-mounted and are connected to the heat dissipation layer 40 by the heat transfer layer filling the through hole formed in the side corresponding to the conductive signal line layer and the LED lamp, it is possible to activate a transfer of heat generated from the LED lamp, and furthermore, it is possible to improve a heat dissipation property of the LED lamp.

In particular, since the LED lamp 100 has the uneven portions formed on the lower surface thereof for increasing the surface area or is connected to the heat dissipation layer through the hole 21 formed in the resin layer 20, it is possible to prevent the LED lamp 100 from being degraded by heat.

Meanwhile, since the heat dissipation layer 40 is formed to be relatively thicker than the conductive signal line layer 30, the flexible circuit board assembly may be maintained in an arbitrary shape, that is, in a bent shape. Since the resin layer 20 and the conductive signal line layer 30 have inherent elasticity and ductility, it is difficult for the above layers to maintain their shapes at the time of bending. However, since the heat dissipation layer 40 having a thickness of 1.5 to 4 times that of the conductive signal line layer 30 is formed on the lower surface of the resin layer 20, a state of the resin layer plastically deformed into a predetermined shape can be maintained. Therefore, it is not necessary to provide a separate case or bracket for maintaining the shape as in the conventional art, and furthermore, it is possible to simplify the structure of the LED lamp assembly and to promote productivity.

While the present disclosure has been described with reference to the exemplary embodiments illustrated in the drawings, it will be understood by those skilled in the art that various modifications and other equivalent embodiments may be made from the scope of the present disclosure. Accordingly, the true technical protective scope of the present disclosure should be determined by the technical spirit of the appended claims.

INDUSTRIAL APPLICABILITY

A flexible circuit board assembly for an LED lamp according to the present disclosure is widely applicable to vehicle lamps, lighting lamps, electronic devices for vehicles, and the like.

The invention claimed is:

1. A flexible circuit board assembly for an LED lamp, which can be mounted in the stepped mounting surfaces of vehicle lamps and maintained in a bent shape, comprising:
a resin layer in a strip shape;
a plurality of LED lamps mounted on the resin layer;
a signal line layer for supplying power to the LED lamps, the signal line layer having conductivity and terminals of the LED lamps and being formed in a predetermined pattern on an upper surface of the resin layer; and
a heat dissipation layer formed on a lower surface of the resin layer, having a thickness relatively thicker than that of the signal line layer having conductivity, and configured to dissipate heat generated from a light emitting diode mounted on the signal line layer, the heat dissipation layer being divided into segments, the number of segments being the same as the number of terminals of the LED lamps, wherein the signal line layer and the heat dissipation layer are formed of one of copper, aluminum, a copper alloy, and an aluminum alloy, and, wherein a hole is formed in sides of the resin layer and the heat dissipation layer corresponding to a region where each LED lamp is mounted, and a heat dissipation member is installed to connect the heat dissipation layer and a lower surface of each LED lamp to transmit heat generated from each LED lamp to the heat dissipation layer.

2. The flexible circuit board assembly of claim 1, wherein a thickness of the heat dissipation layer is formed in a range of 1.5 to 4 times that of the signal line layer having conductivity.

* * * * *